United States Patent
Yanagihara

(10) Patent No.: US 11,830,839 B2
(45) Date of Patent: Nov. 28, 2023

(54) SEMICONDUCTOR DEVICE

(71) Applicant: Murata Manufacturing Co., Ltd., Kyoto (JP)

(72) Inventor: Shingo Yanagihara, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 683 days.

(21) Appl. No.: 16/906,686

(22) Filed: Jun. 19, 2020

(65) Prior Publication Data

US 2020/0402939 A1   Dec. 24, 2020

(30) Foreign Application Priority Data

Jun. 21, 2019   (JP) .................................. 2019-115397

(51) Int. Cl.
*H01L 23/00*   (2006.01)

(52) U.S. Cl.
CPC .... *H01L 24/14* (2013.01); *H01L 2224/14153* (2013.01); *H01L 2924/13051* (2013.01); *H01L 2924/30107* (2013.01)

(58) Field of Classification Search
None
See application file for complete search history.

(56) References Cited

U.S. PATENT DOCUMENTS

| | | | | |
|---|---|---|---|---|
| 6,252,266 B1* | 6/2001 | Hoshi | ................ | H01L 23/4824 |
| | | | | 257/E29.127 |
| 9,484,408 B1* | 11/2016 | Tsai | .................. | H01L 29/42304 |
| 2003/0214016 A1* | 11/2003 | Kiaei | .................. | H01L 23/4824 |
| | | | | 257/E29.022 |
| 2004/0021216 A1* | 2/2004 | Hosoya | .................. | H01L 24/73 |
| | | | | 257/E23.044 |
| 2005/0258452 A1 | 11/2005 | Konishi et al. | | |
| 2006/0138460 A1* | 6/2006 | Sasaki | ................ | H01L 29/7304 |
| | | | | 257/E29.189 |
| 2006/0244540 A1* | 11/2006 | Nakamura | .......... | H03F 3/45085 |
| | | | | 330/252 |
| 2008/0023794 A1* | 1/2008 | Prechtl | .................. | H01L 29/735 |
| | | | | 257/E29.034 |
| 2016/0276277 A1* | 9/2016 | Syu | .................... | H01L 23/49811 |
| 2018/0122939 A1* | 5/2018 | Ota | .................. | H01L 21/823487 |
| 2018/0218921 A1* | 8/2018 | Shimamoto | ........... | H01L 21/563 |

FOREIGN PATENT DOCUMENTS

JP   2005-327805 A   11/2005

* cited by examiner

*Primary Examiner* — Nishath Yasmeen
(74) *Attorney, Agent, or Firm* — Pearne & Gordon LLP

(57) ABSTRACT

A semiconductor device includes at least one transistor disposed on or in a substrate. The transistor is a bipolar transistor including an emitter, a base, and a collector, or a field-effect transistor including a source, a gate, and a drain. At least one first bump connected to the emitter or the source is disposed on the substrate. Furthermore, at least three second bumps connected to the collector or the drain are disposed on the substrate. In plan view, a geometric center of the at least one first bump is located inside a polygon whose vertices correspond to geometric centers of the at least three second bumps.

11 Claims, 9 Drawing Sheets

SEMICONDUCTOR DEVICE

This application claims priority from Japanese Patent Application No. 2019-115397 filed on Jun. 21, 2019. The content of this application is incorporated herein by reference in its entirety.

BACKGROUND

The present disclosure relates to a semiconductor device. An emitter-grounded bipolar transistor (in particular, a heterojunction bipolar transistor) or a source-grounded field-effect transistor (FET) is used in an amplification stage of a power amplifier. In a face-down mounted semiconductor chip, a ground bump connected to the emitter of a bipolar transistor or the source of an FET and an output bump connected to the collector of the bipolar transistor or the drain of the FET are disposed on a substrate (for example, Japanese Unexamined Patent Application Publication No. 2005-327805).

In general, the parasitic inductance of the emitter or source degrades the gain or band characteristics of the power amplifier, and thus reducing of the parasitic inductance is desired.

BRIEF SUMMARY

To reduce the parasitic inductance of the emitter or source of a transistor, a ground bump is disposed near the transistor to reduce the self-inductance of a current path through which an emitter current or source current flows. Further reduction of the parasitic inductance of the emitter or source is desired as the operating frequency of the transistor increases.

The present disclosure provides a semiconductor device capable of reducing the parasitic inductance of an emitter or source.

According to preferred embodiments of the present disclosure, there is provided a semiconductor device including at least one transistor disposed on or in a substrate, the at least one transistor being a bipolar transistor including an emitter, a base, and a collector, or a field-effect transistor including a source, a gate, and a drain; at least one first bump disposed on the substrate and connected to the emitter or the source; and at least three second bumps disposed on the substrate and connected to the collector or the drain. In plan view, a geometric center of the at least one first bump is located inside a polygon whose vertices correspond to geometric centers of the at least three second bumps.

As a result of disposing the first bump and the second bumps in the above-described manner, the parasitic inductance of the emitter or source can be reduced.

Other features, elements, characteristics and advantages of the present disclosure will become more apparent from the following detailed description of preferred embodiments of the present disclosure with reference to the attached drawings.

DETAILED DESCRIPTION

First Embodiment

A semiconductor device according to a first embodiment will be described with reference to FIG. 1 to FIG. 5.

Figure 1:
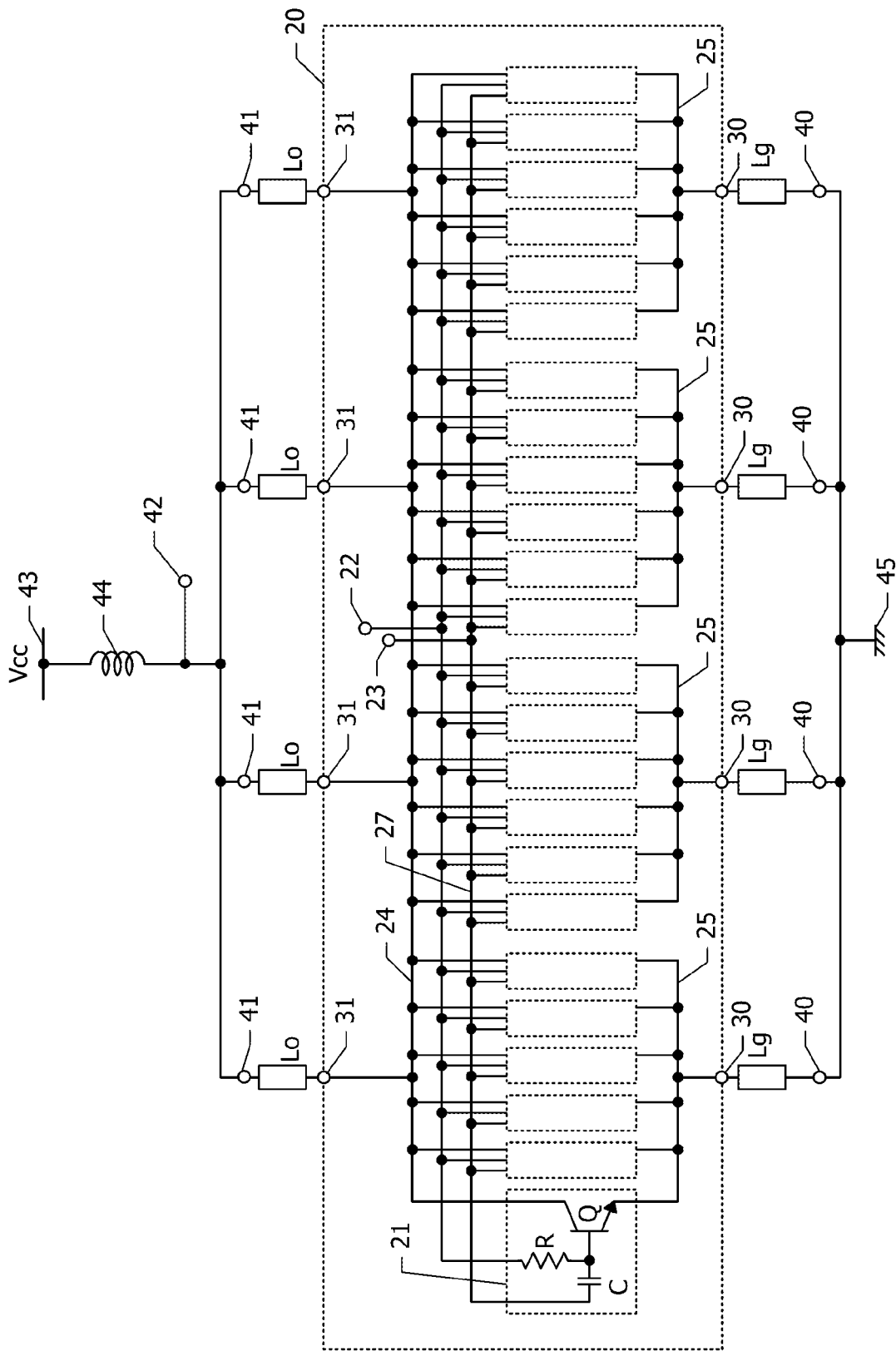
FIG. 1 is an equivalent circuit diagram of a semiconductor device according to a first embodiment.

FIG. 1 is an equivalent circuit diagram of the semiconductor device according to the first embodiment. The semiconductor device according to the first embodiment includes a plurality of cells 21 disposed on or in a semiconductor substrate 20. Each of the plurality of cells 21 includes a transistor Q, an input capacitance element C, and a ballast resistance element R, and these cells 21 are connected in parallel to each other. A heterojunction bipolar transistor (HBT) is used as the transistor Q.

The bases of the plurality of transistors Q are connected to a common input signal line 27 via the respective input capacitance elements C. An input port 23 is connected to the input signal line 27. A radio-frequency (RF) signal is input to the input port 23 from an amplifier circuit in the preceding stage disposed within the semiconductor substrate 20. The bases of the plurality of transistors Q are connected to a common bias port 22 via the respective ballast resistance elements R. A bias current is supplied from a bias circuit disposed on or in the semiconductor substrate 20 to the individual transistors Q via the bias port 22 and the respective ballast resistance elements R.

The collectors of the plurality of transistors Q are connected to a common collector line 24. Four output bumps (second bumps) 31 are connected to the collector line 24. Each of the four output bumps 31 is connected to a corresponding one of output lands 41 of a module substrate 50 (FIG. 3B) by using solder or the like. A current path formed of the output bump 31 and the solder or the like has a collector parasitic inductance Lo.

The output lands 41 of the module substrate 50 are connected to an RF signal output terminal 42 and are also connected to a power supply line 43 via an inductor 44 mounted on or in the module substrate 50. A power supply voltage Vcc is applied to the collectors of the plurality of transistors Q via the inductor 44 and the collector parasitic inductance Lo.

The plurality of cells 21 are grouped into four groups, and each group is made up of six cells 21. In each group, the emitters of the plurality of transistors Q are connected to a common emitter line 25. Four ground bumps (first bumps) 30 are connected to the four respective emitter lines 25. Each of the ground bumps 30 is connected to a corresponding one of ground lands 40 of the module substrate 50 by using solder or the like. The ground lands 40 are connected to a ground plane 45 of the module substrate 50. A current path formed of the ground bump 30 and the solder or the like has an emitter parasitic inductance Lg. In this way, the emitters of the plurality of transistors Q are connected to the ground plane 45 of the module substrate 50 via the emitter parasitic inductance Lg.

Figure 2:
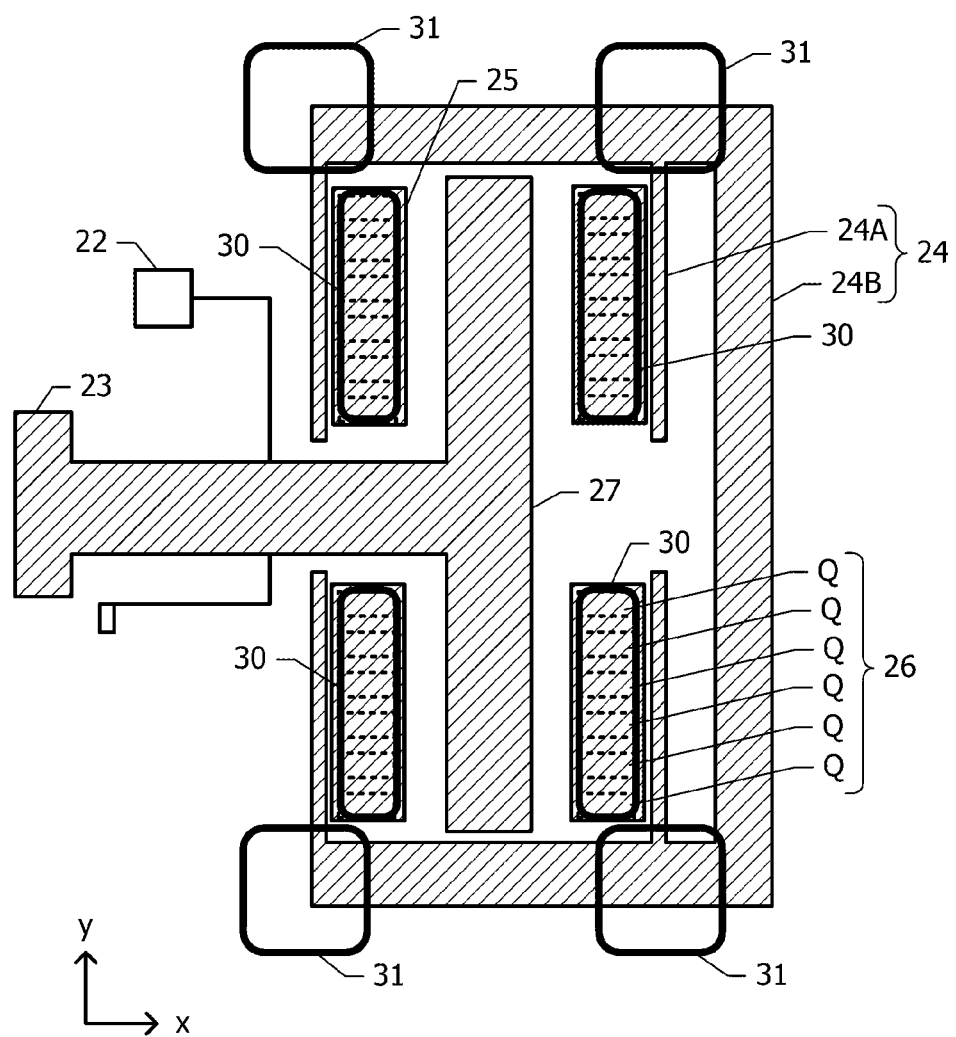
FIG. 2 is a diagram illustrating a plane layout of the individual components of the semiconductor device according to the first embodiment.

FIG. 2 is a diagram illustrating a plane layout of the individual components of the semiconductor device according to the first embodiment. The plurality of transistors Q belonging to one group are arranged in a column to form a transistor column 26. An xy orthogonal coordinate system is defined in which the direction in which the plurality of transistors Q are arranged is a y-direction. Four transistor columns 26 are disposed in a matrix of two rows and two columns in which an x-direction is a row direction and the y-direction is a column direction.

Each transistor column 26 is provided with the emitter line 25 and the ground bump 30. In FIG. 2, the emitter lines 25 are hatched and the ground bumps 30 are illustrated with relatively bold solid lines. In plan view, each emitter line 25 and each ground bump 30 includes the collector layers, base layers, and emitter layers of the plurality of transistors Q of a corresponding one of the transistor columns 26. Each ground bump 30 is connected to the emitter layers of the plurality of transistors Q constituting a corresponding one of the transistor columns 26 via the emitter line 25.

In plan view, collector branch lines 24A are disposed on one sides of the plurality of transistor columns 26. More specifically, the collector branch lines 24A are disposed on outer sides of the two transistor columns 26 arranged in the x-direction. Each collector branch line 24A is electrically connected to the collector layers of the plurality of transistors Q of a corresponding one of the transistor columns 26. The four collector branch lines 24A are connected to a collector common line 24B. The four collector branch lines 24A and the collector common line 24B correspond to the collector line 24 illustrated in FIG. 1. In FIG. 2, the collector branch lines 24A and the collector common line 24B are hatched.

The collector common line 24B is substantially U-shaped with being opened on one side in the x-direction (the left side in FIG. 2) in plan view, and is made up of two portions extending in the x-direction and one portion extending in the y-direction. In plan view, the regions in which the four ground bumps 30 are disposed are located between the two portions extending in the x-direction of the collector common line 24B. The collector branch lines 24A are connected to the portions extending in the x-direction of the collector common line 24B.

In plan view, the input signal line 27 extending in the y-direction is disposed between the two ground bumps 30 arranged in the x-direction. In FIG. 2, the input signal line 27 is hatched. The input signal line 27 extends between the two ground bumps 30 arranged in the y-direction toward one side in the x-direction (the left side in FIG. 2) and reaches the input port 23. Base extended lines (not illustrated) are extended in the x-direction from the bases of the plurality of transistors Q to regions partially overlapping the input signal line 27. The portions at which the base extended lines overlap the input signal line 27 function as the input capacitance elements C (FIG. 1).

The bias port 22 is disposed on a side where the substantially U-shaped collector common line 24B is opened, as viewed from the regions where the four ground bumps 30 are disposed. The bias port 22 is connected to the bases of the transistors Q via the ballast resistance elements R, as illustrated in FIG. 1.

In plan view, the four output bumps 31 are disposed so as to partially overlap the collector common line 24B. In FIG. 2, the output bumps 31 are illustrated with relatively bold solid lines. For example, the output bumps 31 are disposed at four connection portions at which the four collector branch lines 24A are connected to the collector common line 24B.

Figure 3A:
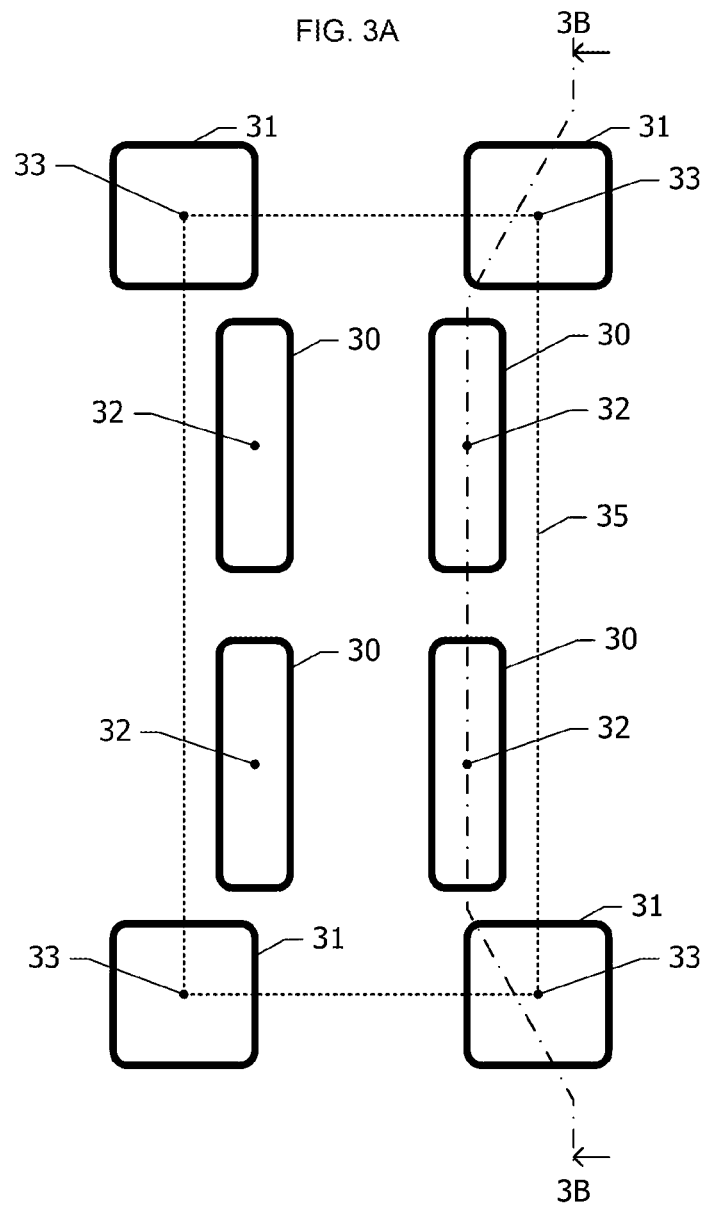
FIG. 3A is a plan view illustrating the positional relationship between four ground bumps and four output bumps.

FIG. 3A is a plan view illustrating the positional relationship between the four ground bumps 30 and the four output bumps 31. In plan view, geometric centers 32 of the respective ground bumps 30 are located inside a polygon 35 whose vertices correspond to geometric centers 33 of the respective output bumps 31. In the first embodiment, the polygon 35 is a rectangle.

Figure 3B:
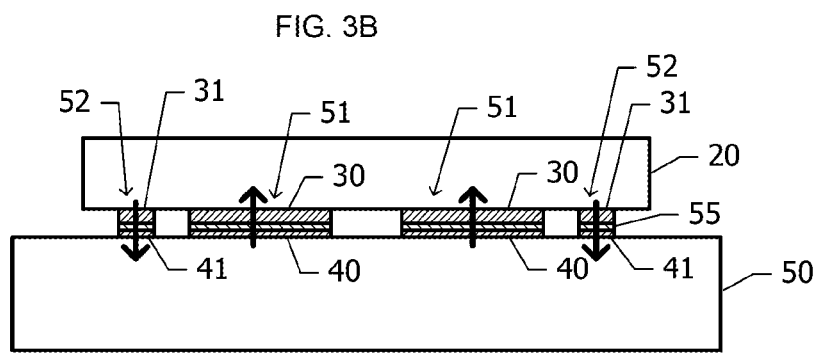
FIG. 3B is a cross-sectional view of the semiconductor device and a module substrate taken along a chain line 3B-3B of FIG. 3A.

FIG. 3B is a cross-sectional view of the semiconductor device and the module substrate 50 taken along a chain line 3B-3B of FIG. 3A. The ground bumps 30 and the output bumps 31 are disposed on a surface facing the module substrate 50 of the semiconductor substrate 20. The ground lands 40 and the output lands 41 are disposed on a mount surface of the module substrate 50. The ground bumps 30 and the output bumps 31 are connected to the ground lands 40 and the output lands 41, respectively, by using solder 55.

The directions of RF signals flowing through current paths 51 including the ground bumps 30, the solder 55, and the ground lands 40 are opposite to the directions of RF currents flowing through current paths 52 including the output bumps 31, the solder 55, and the output lands 41.

Next, advantageous effects of the first embodiment will be described.

In the first embodiment, as illustrated in FIG. 3A, the plurality of ground bumps 30 are disposed inside the polygon 35 whose vertices correspond to the geometric centers 33 of the plurality of output bumps 31. Compared to a case where the number of output bumps 31 is one or two, any one of the plurality of output bumps 31 is disposed near each ground bump 30.

It is known that, when two transmission lines are disposed in parallel to each other and currents in opposite directions flow through the two transmission lines, the inductance of the transmission lines decreases as the distance between the transmission lines decreases. In this specification, the two transmission lines are referred to as "parallel lines" for convenience. In the first embodiment, the ground bumps 30 and the output bumps 31 form two parallel lines through which currents flow in directions opposite to each other. In the first embodiment, each of the plurality of ground bumps 30 is disposed near any one of the plurality of output bumps 31. This disposition reduces the inductance of the current path extending from the output lands 41 of the module substrate 50 to the ground lands 40 via the semiconductor device. That is, the emitter parasitic inductance Lg (FIG. 1) and the collector parasitic inductance Lo (FIG. 1) of the transistors Q are reduced. In other words, the direction of the current flowing through the output bumps 31 connected to the collectors and the direction of the current flowing through the ground bumps 30 connected to the emitters are directions in which magnetic fluxes cancel each other out, and thus the parasitic inductance of the ground bumps 30 and the parasitic inductance of the output bumps 31 can be reduced.

In general, the emitter parasitic inductance Lg of an emitter-grounded power amplifier causes degradation of gain or band characteristics. In the first embodiment, the emitter parasitic inductance Lg is reduced, and thus degradation of gain or band characteristics can be suppressed.

Hereinafter, the result of a simulation performed to confirm the advantageous effects of the first embodiment will be described with reference to FIG. 4 and FIG. 5.

Figure 4:
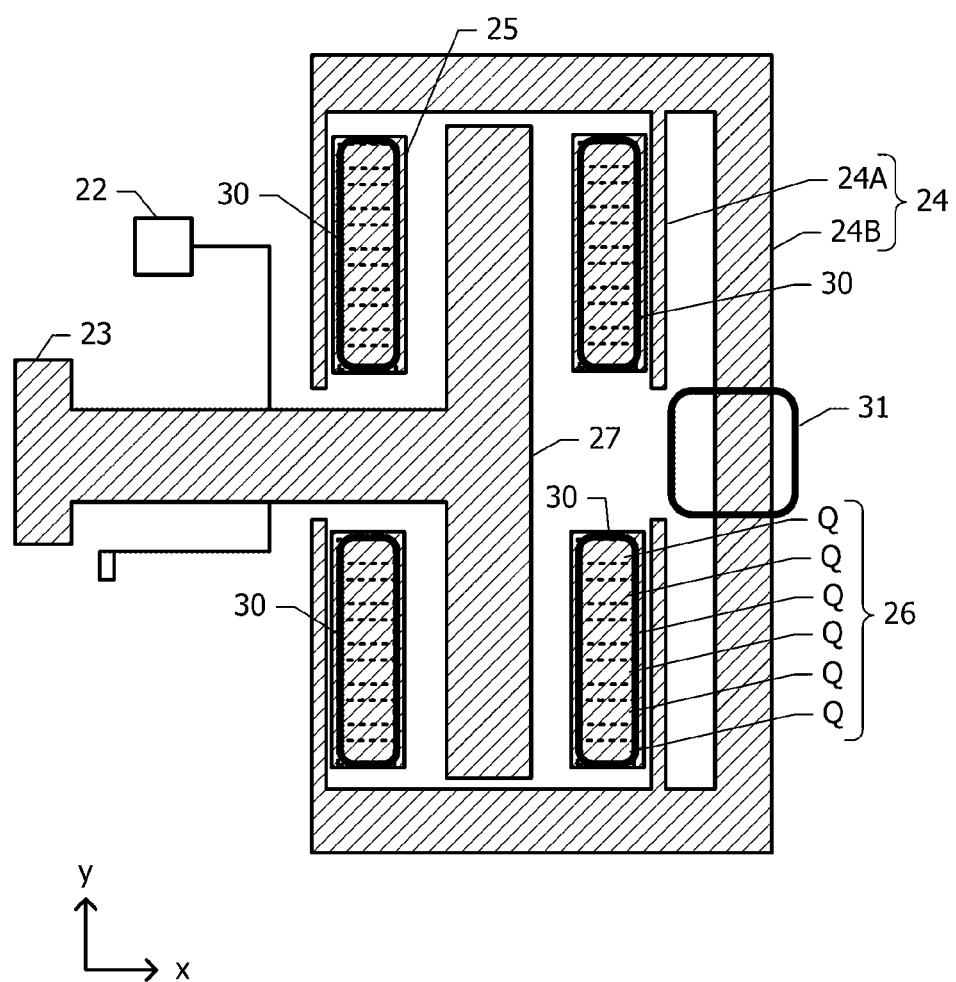
FIG. 4 is a diagram illustrating a plane layout of the individual components of a semiconductor device serving as a simulation target according to a comparative example.

FIG. 4 is a diagram illustrating a plane layout of the individual components of a semiconductor device serving as a simulation target according to a comparative example. In the first embodiment, four output bumps 31 (FIG. 2) are provided. On the other hand, in the comparative example, only one output bump 31 is provided. The one output bump 31 is disposed on the opposite side of the input port 23 as viewed from the region where a plurality of ground bumps 30 are disposed. Except for the disposition of the output bump 31, the configuration of the semiconductor device according to the comparative example is identical to the configuration of the semiconductor device according to the first embodiment (FIG. 2).

The relationship between output and gain was obtained for each of the semiconductor device according to the first embodiment illustrated in FIG. 2 and the semiconductor device according to the comparative example illustrated in FIG. 4. In plan view, each output bump 31 is substantially a square whose one side has a length of about 60 μm, and each ground bump 30 is substantially a rectangle whose long side and short side have lengths of about 180 μm and about 60 μm, respectively. In an actual semiconductor device, the output bump 31 is substantially a corner-rounded square and the ground bump 30 is substantially a corner-rounded rectangle in plan view because of processing restrictions. The frequency of an RF signal input to the input port 23 was about 5 GHz.

Figure 5:
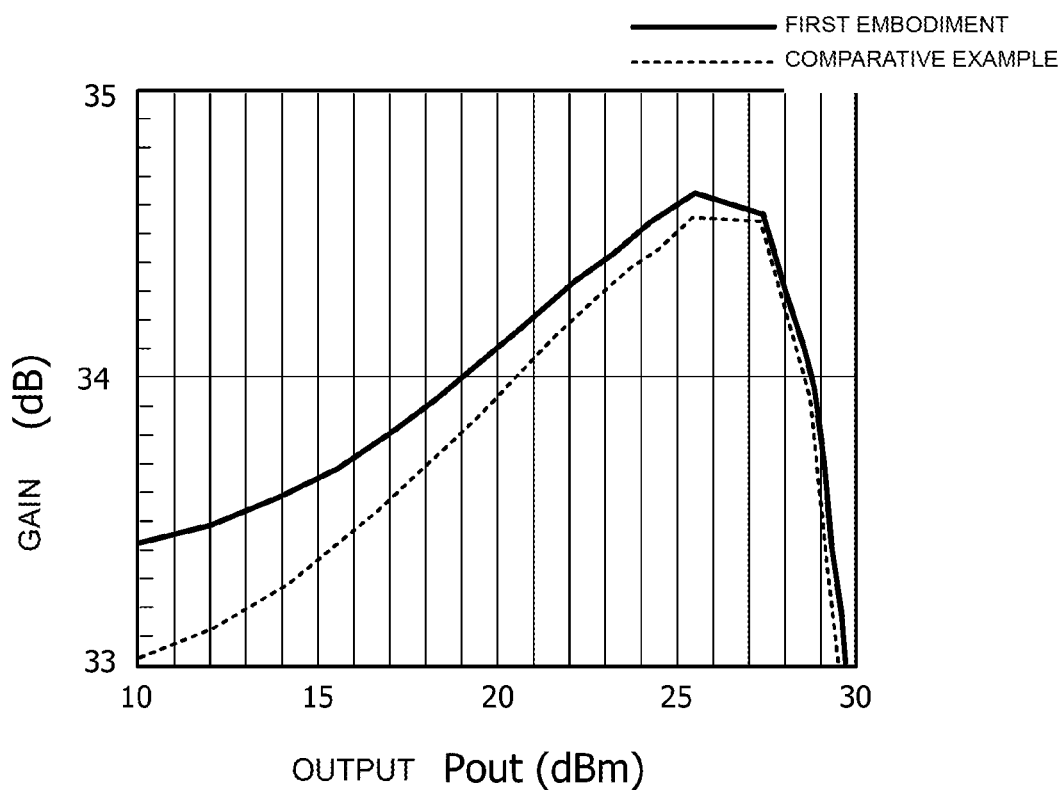
FIG. 5 is a graph illustrating the simulation result of the relationship between output and gain in the semiconductor device according to the first embodiment and the semiconductor device according to the comparative example.

FIG. 5 is a graph illustrating the simulation result of the relationship between output and gain in the semiconductor device according to the first embodiment and the semiconductor device according to the comparative example. The horizontal axis represents output Pout in "dBm", and the vertical axis represents gain in "dB". In the graph in FIG. 5, the solid line and the broken line represent the gain of the semiconductor device according to the first embodiment and the gain of the semiconductor device according to the comparative example, respectively. It is understood that, in almost the entire region where the output is about 10 dBm or more and about 30 dBm or less, the gain of the semiconductor device according to the first embodiment is higher than the gain of the semiconductor device according to the comparative example. It has been confirmed from the simulation that the first embodiment is advantageous compared to the comparative example in which only one output bump 31 is disposed.

Hereinafter, preferred examples of the disposition of the ground bumps 30 and the output bumps 31 will be described with reference to FIG. 6A to FIG. 8.

Each of FIG. 6A to FIG. 8 is a schematic diagram illustrating the positional relationship between a plurality of ground bumps 30 and a plurality of output bumps 31 in plan view. In the example illustrated in FIG. 6A, the geometric centers 33 of four output bumps 31 are located at the positions corresponding to the four vertices of a rectangle (including a square). A plurality of ground bumps 30 are disposed inside the polygon 35 whose vertices correspond to the geometric centers 33 of the output bumps 31. That is, all the ground bumps 30 are included in the polygon 35 in plan view. Thus, the geometric centers 32 of the plurality of ground bumps 30 are also located inside the polygon 35. This positional relationship is similar to the positional relationship in the semiconductor device according to the first embodiment (FIG. 2).

Figure 6A:
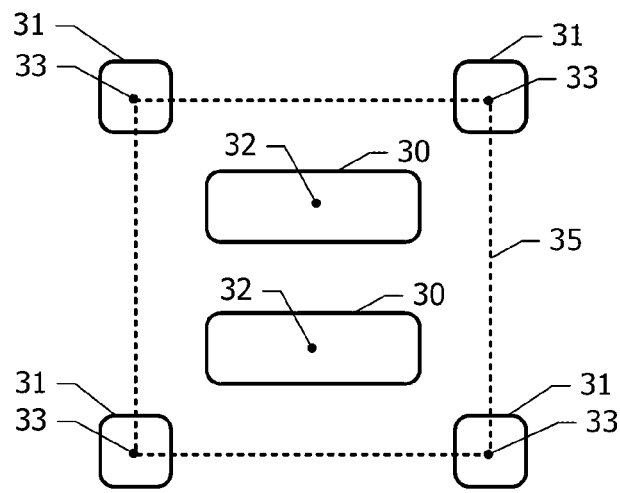
FIG. 6A and FIG. 6B are schematic diagrams each illustrating the positional relationship between ground bumps and output bumps in plan view.
Figure 6B:
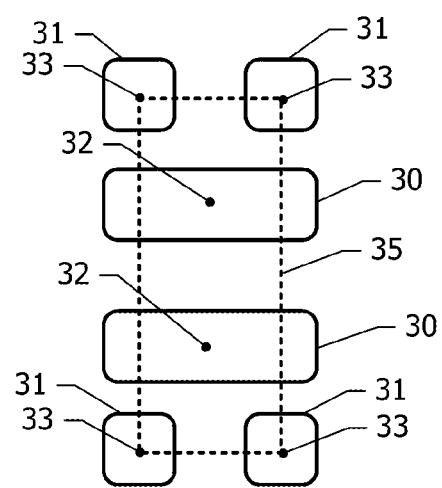

In the example illustrated in FIG. 6B, parts of a plurality of ground bumps 30 extend to the outside of the polygon 35 in plan view. However, the geometric centers 32 of the ground bumps 30 are located inside the polygon 35. Even in such a case where parts of the ground bumps 30 extend to the outside of the polygon 35, advantageous effects equivalent to those of the first embodiment can be obtained if the geometric centers 32 of the ground bumps 30 are located inside the polygon 35.

Figure 7A:
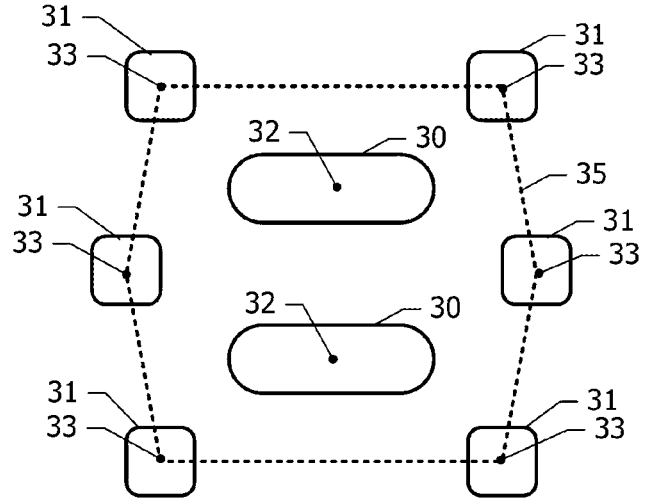
FIG. 7A, FIG. 7B, and FIG. 7C are schematic diagrams each illustrating the positional relationship between ground bumps and output bumps in plan view.

In the example illustrated in FIG. 7A, the number of output bumps 31 is six. The polygon 35 whose vertices correspond to the geometric centers 33 of the six output bumps 31 is a hexagon. As in this case, the polygon 35 whose vertices correspond to the geometric centers 33 of the output bumps 31 may be a polygon other than a quadrangle. Also in this case, it is preferable that the geometric centers 32 of the plurality of ground bumps 30 be located inside the polygon 35.

Figure 7B:
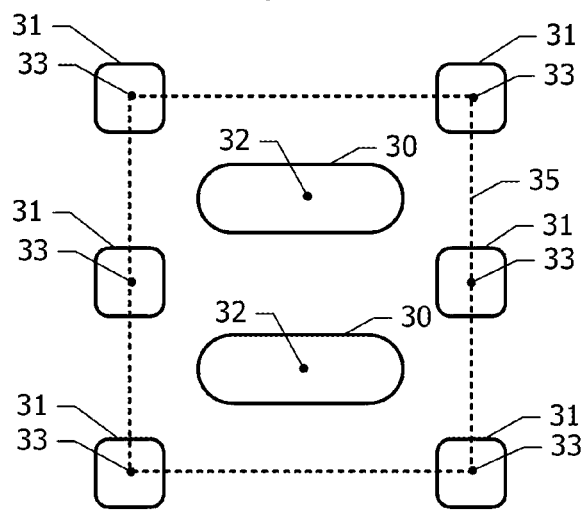

In the example illustrated in FIG. 7B, the geometric centers 33 of two of six output bumps 31 are located on sides of the polygon 35 whose vertices correspond to the geometric centers 33 of the other four output bumps 31. Thus, although the number of output bumps 31 is six, the polygon 35 formed by the geometric centers 33 of the six output bumps 31 is a quadrangle. In this way, even in a case where the number of output bumps 31 is five or more, the polygon 35 formed by the geometric centers 33 of the five or more output bumps 31 may be a quadrangle, such as a rectangle.

Figure 7C:
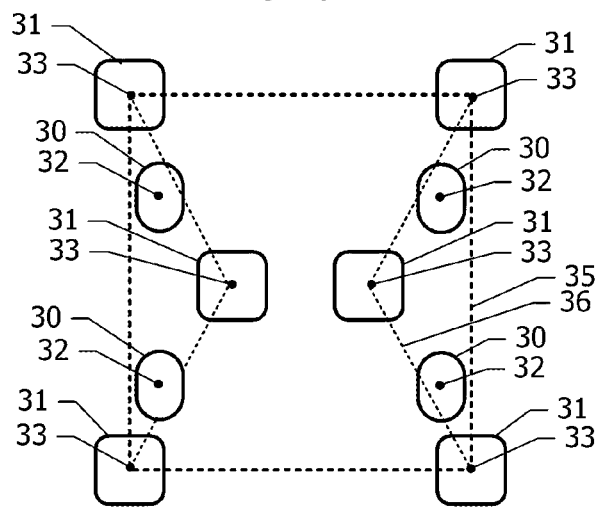

In the example illustrated in FIG. 7C, the geometric centers 33 of four of six output bumps 31 are located at the positions corresponding to the vertices of a rectangle. The geometric centers 33 of the two other output bumps 31 are located inside the rectangle. A polygon 36 whose vertices correspond to the geometric centers 33 of the six output bumps 31 is a concave polygon whose at least one interior angle is larger than about 180 degrees. In such a case, it is preferable that the geometric centers 32 of the ground bumps 30 be located inside the polygon 35 whose vertices correspond to the geometric centers 33 of the output bumps 31 other than the output bumps 31 corresponding to the vertices at which the interior angle is larger than about 180 degrees among the vertices of the polygon 36. Such a polygon 35 corresponds to a largest-area convex polygon whose vertices correspond to the geometric centers 33 of a plurality of output bumps 31. In this case, the geometric centers 32 of the ground bumps 30 may be located outside the polygon 36.

Figure 8:
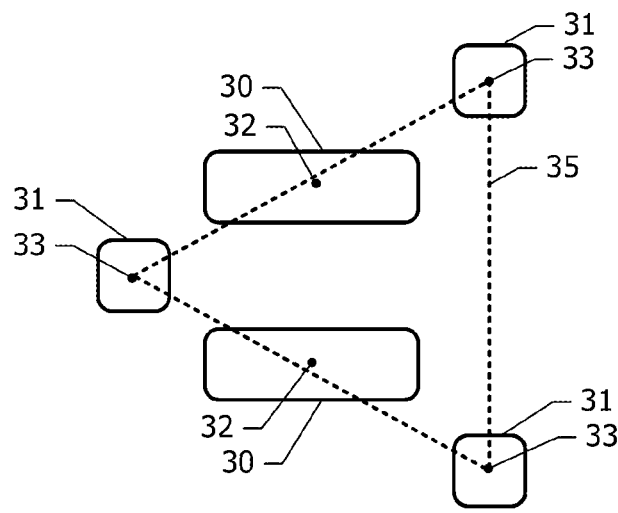
FIG. 8 is a schematic diagram illustrating the positional relationship between ground bumps and output bumps in plan view.

In the example illustrated in FIG. 8, the number of output bumps 31 is three. The polygon 35 whose vertices correspond to the geometric centers 33 of the three output bumps 31 is a triangle. As in this case, the polygon 35 may be a triangle. Also in this case, it is preferable that the geometric centers 32 of the ground bumps 30 be located inside the polygon 35.

Hereinafter, a modification example of the first embodiment will be described.

In the first embodiment, in plan view, the geometric centers 32 of all the ground bumps 30 are located inside the largest-area convex polygon 35 whose vertices correspond to the geometric centers 33 of a plurality of output bumps 31. Alternatively, the geometric center 32 of at least one ground bump 30 may be located inside the largest-area convex polygon 35. Also in this configuration, an effect of reducing the emitter parasitic inductance Lg (FIG. 1) can be obtained.

In the first embodiment, a HBT is used as the transistor Q constituting each cell 21 (FIG. 1). Alternatively, a FET may be used as the transistor Q. In a case where a FET is used as the transistor Q, the source may be connected to the ground bump 30 and the drain may be connected to the output bump 31. Furthermore, the gate may be connected to the input port 23 via the input capacitance element C and may be connected to the bias port 22 via the ballast resistance element R.

Second Embodiment

Hereinafter, a semiconductor device according to a second embodiment will be described with reference to FIG. 9. The description of the same components as those of the semiconductor device according to the first embodiment will be omitted.

Figure 9:
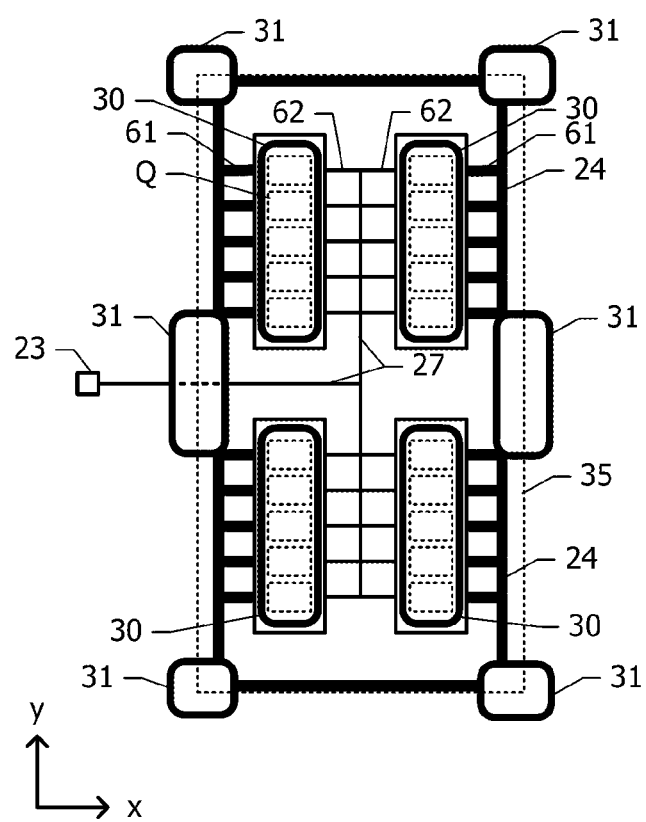
FIG. 9 is a schematic diagram illustrating the positional relationship in plan view among ground bumps, output bumps, and so forth of a semiconductor device according to a second embodiment.

FIG. 9 is a schematic diagram illustrating the positional relationship in plan view among the ground bumps 30, the output bumps 31, and so forth of the semiconductor device according to the second embodiment. In the first embodiment, four output bumps 31 are disposed (FIG. 2). In contrast, in the second embodiment, six output bumps 31 are disposed. Four ground bumps 30 are disposed in a matrix of two rows and two columns, as in the first embodiment. An xy orthogonal coordinate system is defined in which the row direction is an x-direction and the column direction is a y-direction.

The two ground bumps 30 in the first row are surrounded by the substantially U-shaped collector line 24 in three directions other than the direction facing the two ground bumps 30 in the second row. The two ground bumps 30 in the second row are surrounded by the substantially U-shaped collector line 24 in three directions other than the direction facing the two ground bumps 30 in the first row.

Four of the six output bumps 31 are disposed at four bent portions of the collector lines 24. The two other output bumps 31 are disposed at the ends of portions extending in the y-direction of the two collector lines 24. The two collector lines 24 are connected to each other by the two output bumps 31.

When the x-direction is defined as a right-left direction and the y-direction is defined as an up-down direction, collector extended lines 61 are extended leftward from the collectors of the plurality of transistors Q connected to the two ground bumps 30 disposed on the left. Also, collector extended lines 61 are extended rightward from the collectors of the plurality of transistors Q connected to the two ground bumps 30 disposed on the right. The plurality of collector extended lines 61 are connected to the portions extending in the y-direction of the collector lines 24.

Base extended lines 62 are extended rightward from the bases of the plurality of transistors Q connected to the two ground bumps 30 disposed on the left. Base extended lines 62 are extended leftward from the bases of the plurality of transistors Q connected to the two ground bumps 30 disposed on the right. The input signal line 27 has a portion extending in the y-direction and disposed between the ground bumps 30 in the x-direction, and a portion extending leftward in the x-direction from the midpoint of the portion extending in the y-direction. The plurality of base extended lines 62 are connected to the portion extending in the y-direction of the input signal line 27 via the input capacitance elements C (FIG. 1). The portion extending in the x-direction of the input signal line 27 reaches the input port 23.

Next, advantageous effects of the second embodiment will be described.

In the second embodiment, the output bumps 31 are disposed at the positions corresponding to the ends of portions extending in the y-direction of the collector lines 24 in addition to the positions corresponding to the four output bumps 31 of the collector line 24 according to the first embodiment (FIG. 2). In the second embodiment, the output bumps 31 that are disposed at the positions corresponding to the ends of the portions extending in the y-direction of the collector lines 24 are disposed near lower ends of the two ground bumps 30 in the first row and upper ends of the two ground bumps 30 in the second row. Thus, the substantial distances between the ground bumps 30 and the output bumps 31 are smaller than in the first embodiment. As a result, the emitter parasitic inductance Lg (FIG. 1) can be further reduced. In other words, the direction of the current flowing through the output bumps 31 connected to the collectors and the direction of the current flowing through the ground bumps 30 connected to the emitters are directions in which magnetic fluxes cancel each other out. Thus, the parasitic inductance of the ground bumps 30 and the parasitic inductance of the output bumps 31 can be reduced.

Third Embodiment

Hereinafter, a semiconductor device according to a third embodiment will be described with reference to FIG. 10. The description of the same components as those of the semiconductor device according to the second embodiment (FIG. 9) will be omitted.

Figure 10:
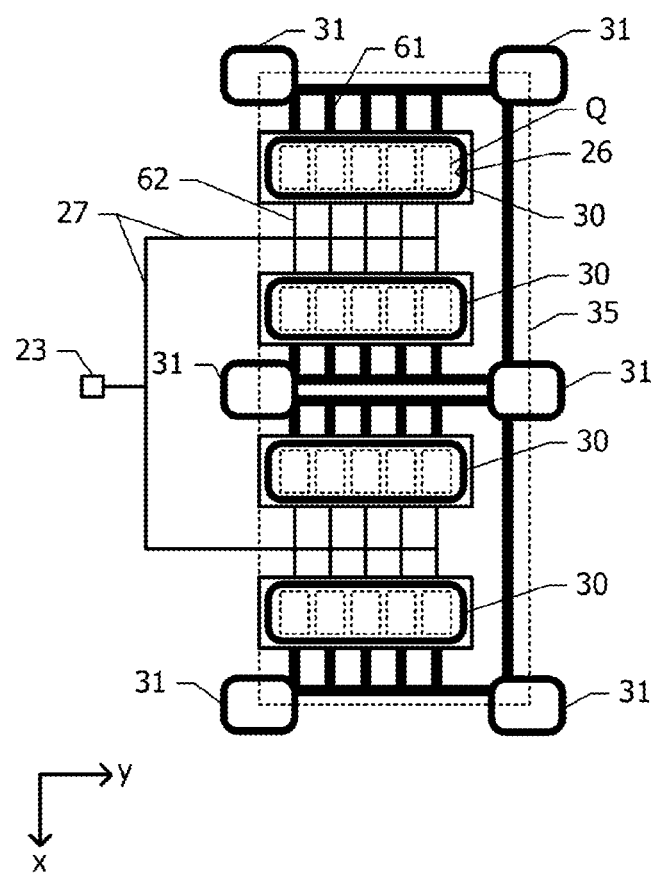
FIG. 10 is a schematic diagram illustrating the positional relationship in plan view among ground bumps, output bumps, and so forth of a semiconductor device according to a third embodiment.

FIG. 10 is a schematic diagram illustrating the positional relationship in plan view among the ground bumps 30, the output bumps 31, and so forth of the semiconductor device according to the third embodiment. As in the second embodiment, the direction in which the plurality of transistors Q constituting the transistor columns 26 are arranged is defined as the y-direction. In the second embodiment, the four ground bumps 30 are disposed in a matrix of two rows and two columns. In contrast, in the third embodiment, the four ground bumps 30 are arranged in one column in the x-direction (in a matrix of four rows and one column).

The two ground bumps 30 in the first and second rows are surrounded by the substantially U-shaped collector line 24 in three directions other than the left direction. Likewise, the two ground bumps 30 in the third and fourth rows are surrounded by the other substantially U-shaped collector line 24 in three directions other than the left direction. A plurality of output bumps 31 are disposed at the bent portions of the collector lines 24 and the ends of portions extending in the y-direction of the collector lines 24. The output bumps 31 disposed between the ground bumps 30 in the second and third rows are shared by the two upper and lower collector lines 24. Thus, the number of output bumps 31 is six.

The positional relationship between the transistor columns 26, and the collector extended lines 61 and the base extended lines 62 is similar to that in the semiconductor device according to the second embodiment. The input signal line 27 is disposed between the ground bump 30 in the first row and the ground bump 30 in the second row, and between the ground bump 30 in the third row and the ground bump 30 in the fourth row. These portions of the input signal line 27 extend in the y-direction and are combined into one portion, which reaches the input port 23.

Next, advantageous effects of the third embodiment will be described.

Also in the third embodiment, six output bumps 31 are disposed, and thus the substantial distances between the ground bumps 30 and the output bumps 31 are small as in the second embodiment. As a result, the emitter parasitic inductance Lg (FIG. 1) can be further reduced. In other words, the direction of the current flowing through the output bumps 31 connected to the collectors and the direction of the current flowing through the ground bumps 30 connected to the emitters are directions in which magnetic fluxes cancel each other out. Thus, the parasitic inductance of the ground bumps 30 and the parasitic inductance of the output bumps 31 can be reduced.

While preferred embodiments of the disclosure have been described above, it is to be understood that the disclosure is not limited to the embodiments and that variations, modifications, improvements, combinations, replacements, and the like will be apparent to those skilled in the art without necessarily departing from the scope and spirit of the disclosure. Similar functions and effects of similar configurations of a plurality of embodiments are not described in each embodiment. The scope of the disclosure, therefore, is to be determined solely by the following claims.

What is claimed is:

1. A semiconductor device comprising:
   at least one transistor on or in a substrate;
   at least one first bump on the substrate and connected to an emitter or a source of the at least one transistor; and
   at least three second bumps on the substrate and connected to a collector or a drain of the at least one transistor,
   a common collector line connected to the collector or a common drain line connected to the drain of the at least one transistor,
   wherein as seen in a plan view of the substrate, a geometric center of the at least one first bump is within a polygon whose vertices are at geometric centers of the at least three second bumps, and
   wherein as seen in a plan view of the substrate, the at least three second bumps on the substrate overlap the common collector line or the common drain line.

2. The semiconductor device according to claim 1, wherein the polygon is a convex polygon.

3. The semiconductor device according to claim 1, wherein the polygon is a concave polygon.

4. The semiconductor device according to claim 1, wherein the polygon is a triangle.

5. A semiconductor device comprising:
   at least one transistor on or in a substrate;
   at least one first bump on the substrate and connected to an emitter or a source of the at least one transistor; and
   at least three second bumps on the substrate and connected to a collector or a drain of the at least one transistor,
   wherein as seen in a plan view of the substrate, a geometric center of the at least one first bump is within a polygon whose vertices are at geometric centers of the at least three second bumps, and
   wherein at least a portion of the at least one first bump is outside the polygon.

6. The semiconductor device according to claim 3, wherein at least a portion of the at least one first bump is outside the polygon.

7. The semiconductor device according to claim 4, wherein at least a portion of the at least one first bump is outside the polygon.

8. The semiconductor device according to claim 1, comprising a plurality of transistors on or in the substrate.

9. A semiconductor device comprising:
   at least one transistor on or in a substrate;
   at least one first bump on the substrate and connected to an emitter or a source of the at least one transistor; and
   at least six second bumps on the substrate and connected to a collector or a drain of the at least one transistor,
   a common collector line connected to the collector or a common drain line connected to the drain of the at least one transistor,
   wherein as seen in a plan view of the substrate, a geometric center of the at least one first bump is within a first polygon whose vertices are at geometric centers of at least four of the second bumps, and is outside a second polygon whose vertices are at geometric centers of the at least six second bumps, and
   wherein as seen in a plan view of the substrate, the at least six second bumps on the substrate overlap the common collector line or the common drain line.

10. The semiconductor device according to claim 9, wherein:
    the geometric center of the at least one first bump is within a third polygon whose vertices are at geometric centers of at least three of the second bumps, and
    the first polygon and the third polygon share at least two second bumps.

11. The semiconductor device according to claim 9, comprising a plurality of transistors on or in the substrate.

* * * * *